United States Patent
Bezinge et al.

[11] Patent Number: 5,668,826
[45] Date of Patent: Sep. 16, 1997

[54] ELECTRO-OPTICAL DEVICE COMPRISING A CONTROLLED LASER DIODE

[75] Inventors: Alex Bezinge, Yens; Christophe Moser, Pully; Pierre Thomann, Fountainemelon; Alain Jornod, Colombier, all of Switzerland

[73] Assignee: Tesa Brown & Sharpe SA, Renens, Switzerland

[21] Appl. No.: 611,632

[22] Filed: Mar. 6, 1996

[30] Foreign Application Priority Data

Mar. 14, 1995 [EP] European Pat. Off. ............ 95810168

[51] Int. Cl.$^6$ ................ H01S 3/13; G02B 6/00; G01B 9/02; H04B 10/04
[52] U.S. Cl. ................ 372/32; 372/12; 372/29; 372/43; 372/109; 385/12; 385/33; 385/93; 356/345; 359/180; 359/188
[58] Field of Search ............... 372/7, 6, 12, 29, 372/32, 43, 46, 50, 109; 385/12, 33, 31, 39, 93; 356/345, 352, 346; 359/180, 188, 131

[56] References Cited

U.S. PATENT DOCUMENTS

| | | | |
|---|---|---|---|
| 4,756,003 | 7/1988 | Baer et al. | 372/75 |
| 4,829,533 | 5/1989 | Hallberg et al. | 372/29 |
| 4,872,177 | 10/1989 | Baer et al. | 372/75 |
| 4,897,682 | 1/1990 | Horiuchi et al. | 346/160 X |
| 5,148,437 | 9/1992 | Ohtsu | 372/32 |
| 5,195,102 | 3/1993 | McLean et al. | 372/32 |
| 5,387,881 | 2/1995 | Schweda et al. | 331/94.1 |
| 5,513,195 | 4/1996 | Opower et al. | 372/18 |

FOREIGN PATENT DOCUMENTS

| | | | |
|---|---|---|---|
| 0 133 394 | 2/1985 | European Pat. Off. | 372/32 X |
| 0 414 194 | 2/1991 | European Pat. Off. | 372/32 X |
| 0 479 118 | 9/1991 | European Pat. Off. | 372/32 X |
| 27 41 700 | 3/1979 | Germany | 372/32 X |

OTHER PUBLICATIONS

Technische Mitteilungen 85 Heft May 1, 1992, pp. 34–43, A. Abou–Zeid "Diodenlaser in der industriellen messtechnik".
Patent Abstracts of Japan, vol. 15, No. 273 Jul. 11, 1991 & JP 03091283 Apr. 16, 1991.
Patent Abtracts of Japan, vol. 4, No. 184, Dec. 18, 1980; JP 55126208 Sep. 29, 1980.
Patent Abstracts of Japan, vol. 11, No. 161, May 23, 1987 & JP 61292977.

*Primary Examiner*—Brian Healy
*Attorney, Agent, or Firm*—Jacobson, Price, Holman & Stern, PLLC

[57] ABSTRACT

The laser diode (11) of the electro-optical device (10) is frequency-controlled with the aid of a control module (40) comprising a rubidium cell (41) and an optical sensor (42), as well as a further module (43) for controlling the injection current and/or the temperature of the laser diode. A controlling light beam (18) is conveyed by means of a multi-mode optical fiber (14) to the rubidium cell. The optical sensor measures the intensity of the light beam transmitted by the rubidium cell and supplies a signal used by the further module for regulating the injection current and/or the temperature of the laser diode so as to stabilize the frequency of the light (16) emitted. The optical fiber is coupled to the laser module in such a way as to collect part of the light (16, 21) emitted by the front face of the laser diode and reflected by a lens (12) in front of the laser diode. The diode-lens assembly is heat controlled. Feedback in the laser diode and the power supplied to the laser diode are reduced, and the control device is simplified. The device finds application particularly in interferometry, atomic frequency oscillators, spectroscopy, and fiber optics data transmission.

19 Claims, 4 Drawing Sheets

ELECTRO-OPTICAL DEVICE COMPRISING A CONTROLLED LASER DIODE

BACKGROUND OF THE INVENTION

This invention relates to electro-optical devices, and more particularly to an electro-optical device of the type having a controlled laser diode.

For several years now, owing to the advent of compact disks and laser printers, for example, laser diodes have been mass-produced on a large scale and have therefore become very economical. In certain fields of application, they are even increasingly replacing conventional gas lasers owing to their great advantages of miniaturization, long life, efficiency, and ease of execution.

Thus, there are currently a large number of different types of laser diodes, e.g., double-heterojunction diodes, DBR (distributed Bragg reflector) diodes, vertical-cavity diodes, etc., corresponding to a large number of different needs.

Double-heterojunction laser diodes of the AsGaAl type, for instance, find use in a great many different applications. They emit laser light with a wavelength between 750 nm and 880 nm, close to the visible spectrum and adapted to the usual silicon photoelectric receivers.

The light frequency emitted by this type of diodes depends upon two parameters:
- the injection current causes the frequency to vary by 3 GHz/mA, or 0.006 nm/mA;
- the temperature causes the frequency to vary by 30 GHz/°C., or 0.06 nm/°C.

For many applications, it is necessary to have a laser source emitting at an absolutely stable frequency or wavelength. This is the case for laser diodes used in interferometers, in atomic frequency oscillators, in spectroscopy, or in telecommunications, for example. In such applications, it is therefore necessary to use either an expensive and bulky gas laser or a laser diode having a stabilized emission frequency.

Steady current sources can be designed producing a current of 150 mA with an accuracy of ±5 µA. If this current is applied to a laser diode, the frequency inaccuracy will therefore be about $df/f=5\cdot10^{-8}$. Over a long period of time, it is difficult to guarantee a more accurate temperature of the diode than ±1 mK. This corresponds to a df/f error of $8\cdot10^{-8}$.

For some of the previously mentioned applications, the accuracy yielded by the foregoing means proves to be insufficient. Moreover, even if it were possible to maintain a sufficiently constant current and temperature, variations due to aging of the laser diode could not be compensated for with this method. It is therefore necessary to stabilize the laser diode with the aid of an outside reference element.

A. Abou-Zeid, in his article entitled, "Diodenlaser in der industriellen Meβtechnik," *Technische Mitteilungen* 85, No. 1, May 1992, pp. 34–43, describes an interferometer using a laser diode stabilized by means of an outside reference element. In FIG. 14 on page 40, the light beam emitted by the laser diode is split by means of a beam splitter into a measuring beam and a control beam. In this article, the measuring beam is used for an interferometry application. The control beam reaches an outside reference element, constituted in FIG. 14 by a Fabry-Perrot etalon and in FIG. 15 by an absorption cell. A sensor measures the intensity of the beam which has passed through the reference element and supplies a signal used by adjusting means to control the current and/or the temperature applied to the laser diode. The reference element is made up in such a way as to attenuate certain wavelengths selectively or, on the contrary, to become resonant when a certain wavelength reaches it. In the design of FIG. 15, the absorption cell contains a gas having an absorption peak situated very precisely at the frequency at which it is desired to lock up the laser diode. The adjusting means control the emission of the diode so that the intensity of the beam passing through the cell is minimal, which amounts to locking up the optical emission frequency of the laser diode to the peak absorption frequency of the cell.

U.S. Pat. No. 5,148,437 describes an atomic frequency oscillator using a laser diode stabilized in a similar manner. In Figure 1b in particular, in element 24, the beam of the laser diode is seen to be separated by means of a beam splitter into a measuring beam and a control beam. The control beam reaches an optical resonator 24d, and a photosensor 24e supplies a signal used by control means 24f, 24g, 24h, 24i to control the current injection of the laser diode so that it emits precisely at the resonance frequency of the optical resonator 24e. In this application, the measuring beam is used to pump atoms optically into a resonance cell 21C.

However, these two solutions have a number of drawbacks making their use problematic. Part of the light beam emitted by the laser diode is reflected by the surface of the beam splitter and returned toward the laser diode. This feedback of light into the laser diode modifies certain emission characteristics, such as the wavelength or the mode of emission, and therefore makes stabilization very difficult. Several solutions have been proposed for reducing, but not eliminating, the undesirable feedback: by treating the faces of the beam splitter with antireflective coatings, by disaligning the beam splitter in relation to the optical axis, or by using an optical insulator, as indicated in the left-hand column on page 37 of the Abou-Zeid reference, for example. Although such operations do improve the device, they entail complications and additional costs.

Furthermore, upon temperature fluctuations, the distance between the laser diode and the interface of the beam splitter changes because of the dilation. The phase and/or amplitude of the light returned to the laser diode therefore depends upon the temperature, making it difficult to predict how the device will perform.

In addition, the positioning of the various components is complicated in these two designs. The absorption cell, which may be quite large in volume according to the chosen gas, must be positioned in the optical path of the light beam, i.e., near the laser diode and the measuring circuit. If the laser diode is placed on a printed circuit, it may be difficult to fix the absorption cell there and to adjust it correctly. Moreover, and particularly in the disclosure of U.S. Pat. No. 5,148,437, the photosensor 24e may be disturbed by the electromagnetic fields caused by the components of the atomic oscillator, especially by the microwave generator. The value measured by this sensor may then be distorted, and the stabilization of the laser diode is affected thereby.

In the two foregoing designs, the beam splitter separates the light beam emitted by the laser diode into two beams—a measuring beam and a controlling beam—of substantially equal intensity. Now, the control means can generally do with a small fraction of the light intensity required by the rest of the electro-optical device. In a typical interferometry application, the control circuit could do with about 2 or 3% of the light intensity required by the interferometer, whereas in these designs it receives the same intensity. The laser diode must therefore operate at a needlessly high power, thus reducing its life span, hastening aging, generating undesirable heating, and wasting energy.

European Patent No. 0 479 118 to Dornier describes a device in which the light beam necessary for controlling a laser diode is taken off by means of an optical fiber placed directly in front of the laser diode. With this solution, the laser diode can be positioned very freely with respect to the rest of the device. However, the latter uses a single-mode optical fiber, difficult to put to work and requiring precautions for the alignment with the laser diode. Moreover, a single-mode fiber is not capable of conveying a light beam of a certain intensity. Hence this device is suitable only for devices in which the the intensity demanded of the operating light beam is low, e.g., in this patent, for fiber optics sensor devices.

Moreover, this solution merely shifts the problems connected with beam splitting remote from the laser diode. In order to effect the separation between the operating light beam and the controlling light beam, it is necessary in this design, too, to provide a beam-splitting element, here in the form of a fiber optics coupler. However, this type of coupler is at least as difficult to produce as a beam splitter. The light entering the prior art couplers passes through an optical interface which returns part of the light toward the laser diode through the optical fiber.

Coupling a single-mode fiber to a Fabry-Perot cavity as is done generates a very great feedback. Hence it is not possible to use the teaching of this patent for applications sensitive to problems of abrupt changes of mode.

Finally, the problem of the power to be furnished to the laser diode is not solved by the above-mentioned patent any more than by the other prior art. Conventional fiber optics couplers in fact split the incoming light beam into two beams of equal intensity. Consequently, the control means receive a light intensity equal to the rest of the device, even though they could do with a fraction of that intensity in many applications.

L. Pujol et al., in a paper entitled "Interféromètre intégré stabilisé par absorption atomique," presented at the OPTICS 92 conference in Paris, describe a laser module stabilized by atomic absorption which avoids some of the drawbacks discussed above. In this reference, the laser diode is a Fabry-Perot laser diode emitting light from both faces. The light emitted by the front face constitutes the operating light beam used for the specific application, here for a device for measuring length by interferometry, whereas the light emitted by the rear face is recovered by an optical fiber and conveyed toward control means which may thus be situated elsewhere. Hence the controlling light beam does not pass through any optical interface between the laser diode and the control means, whereby one of the sources of light feedback in the laser diode can be eliminated.

However, this solution likewise poses a number of problems. For even if, theoretically, all laser diodes having a Fabry-Perot cavity can emit light both from the rear face and from the front face, the majority of the commercially available diodes are optimized and encapsulated so as to emit light only from the front face. Only a limited selection of costly diodes are capable of emitting from both faces.

What is more, placement of the laser diode becomes absolutely critical since its front face must be aligned with the integrated optical device and its rear face with the optical fiber. Both these elements are characterized by a limited optical aperture, thus necessitating careful machining of the laser module. Finally, the light emitted by the laser diode directly enters an integrated optical circuit performing the interferometry function. Some of the light emitted is reflected at the interface of the integrated circuit and returned toward the laser diode. Hence this design does not at all solve the problem of feedback, nor that of the behavior varying with the temperature owing to variations of the index of reflection.

Japanese Patent No. 3,091,283 describes a laser module in which an optical fiber is placed so as to take off part of the light emitted by the laser diode which does not reach the lens. This solution requires an oversize emission cone, hence a waste of power, of the laser diode.

Japanese Patent Publication No. 55 126,208 proposes fixing an optical fiber directly to the surface of the laser diode, even before the lens. This solution is complicated to carry out and is not very suitable for miniaturized laser diodes.

Japanese Patent Publication No. 61 292,977 teaches the recovery by means of an optical fiber of part of the light emitted by the laser diode which reaches the case of the module rather than the lens. Once more, this solution requires an oversize emission cone of the laser diode and therefore a waste of power, causing needless heating of the diode.

German Disclosed Application (DOS) No. 27 41,700 is similar in that it proposes placing the optical fiber in the periphery of the emission cone of the laser diode, only the central area of this cone being used. Hence this solution suffers from the same drawbacks.

SUMMARY OF THE INVENTION

Thus, it is an object of this invention to provide an electro-optical device comprising a controlled laser diode exhibiting the advantages of prior art designs but without the mentioned drawbacks.

Another object of the invention is to provide such a device having a laser module equipped with a controlled laser diode which retains the ease of placement of the laser diode while avoiding the disadvantages of the prior art, especially allowing the light necessary for control of the laser diode to be taken off by means of an optical fiber with a minimum of feedback and interference for the laser diode.

Still another object is to provide such an electro-optical device including means for limiting the power which needs to be supplied to the laser diode.

A further object of this invention is to provide an electro-optical means having another type of module with a controlled laser diode in which the optical path traveled by the controlling light beam between the laser diode and the control means does not include any beam-splitting element, and wherein all sources of feedback in the laser diode are generally reduced to the greatest extent possible.

Another object of the invention is to provide such an electro-optical device having a laser module produced with commercially available laser diodes, preferably ordinary Fabry-Perot, DBR, or vertical-cavity (VCSEL) laser diodes, requiring no particular precautions during manufacture or assembly.

Still another object of this invention is to provide an electro-optical device comprising a controlled laser diode wherein variations of reflection and feedback due to variations of temperature, especially of the lens in front of the laser diode, are substantially reduced or eliminated.

To this end, in the electro-optical device according to the present invention, of the type initially mentioned, the controlling light beam is taken off by means of an optical fiber coupled to the laser module in such a way as to collect part of the light reflected or diffused by the lens. By means of this optical fiber, it is possible to recover a percentage of the light emitted and immediately lost, e.g., owing to reflection and diffusion on the first lens.

In this way, the use of a beam-splitting element to take off the controlling beam is avoided, and one of the main sources of feedback is thus eliminated. Moreover, ordinary laser diodes emitting from the front face can be used.

The optical fiber permits a clear separation between the functions of control and measurement or transmission and their execution by means of physically remote modules. Construction of the device and positioning of the various modules are thus facilitated, and it is easier to protect the different modules from reciprocal or outside electromagnetic influences.

Depending upon the application, the controlling light beam may represent only a small fraction of the light emitted by the laser diode, preferably less than 10%. Owing to this feature, it is possible to limit the operating power of the laser diode.

According to another feature, the laser diode is frequency stabilized. This feature permits limitation of the frequency variations of the laser diode due, for example, to variations of the ambient temperature, to untimely variations of the injection current, or to aging of the laser diode.

According to another feature, the reference cell consists of an absorption cell containing a gas having a spectral absorption peak by which the frequency of the light emitted by the diode is controlled.

According to another feature, the laser module further comprises a module permitting the temperature of the laser diode and the lens to be controlled simultaneously.

In one embodiment of the invention, the controlling light beam is conveyed by an optical fiber to the control module, while a measuring or communications device uses the operating light beam directly at the output of the laser diode.

In another embodiment of the invention, the controlling light beam is conveyed by an optical fiber to the control module, while the operating light beam is conveyed by a second optical fiber to the measuring or communications device.

BRIEF DESCRIPTION OF THE INVENTION

Other objects and advantages of the invention will become apparent from the following detailed description of preferred embodiments thereof, taken in conjunction with the accompanying drawings, in which.

DETAILED DESCRIPTION OF THE INVENTION

Figure 1:
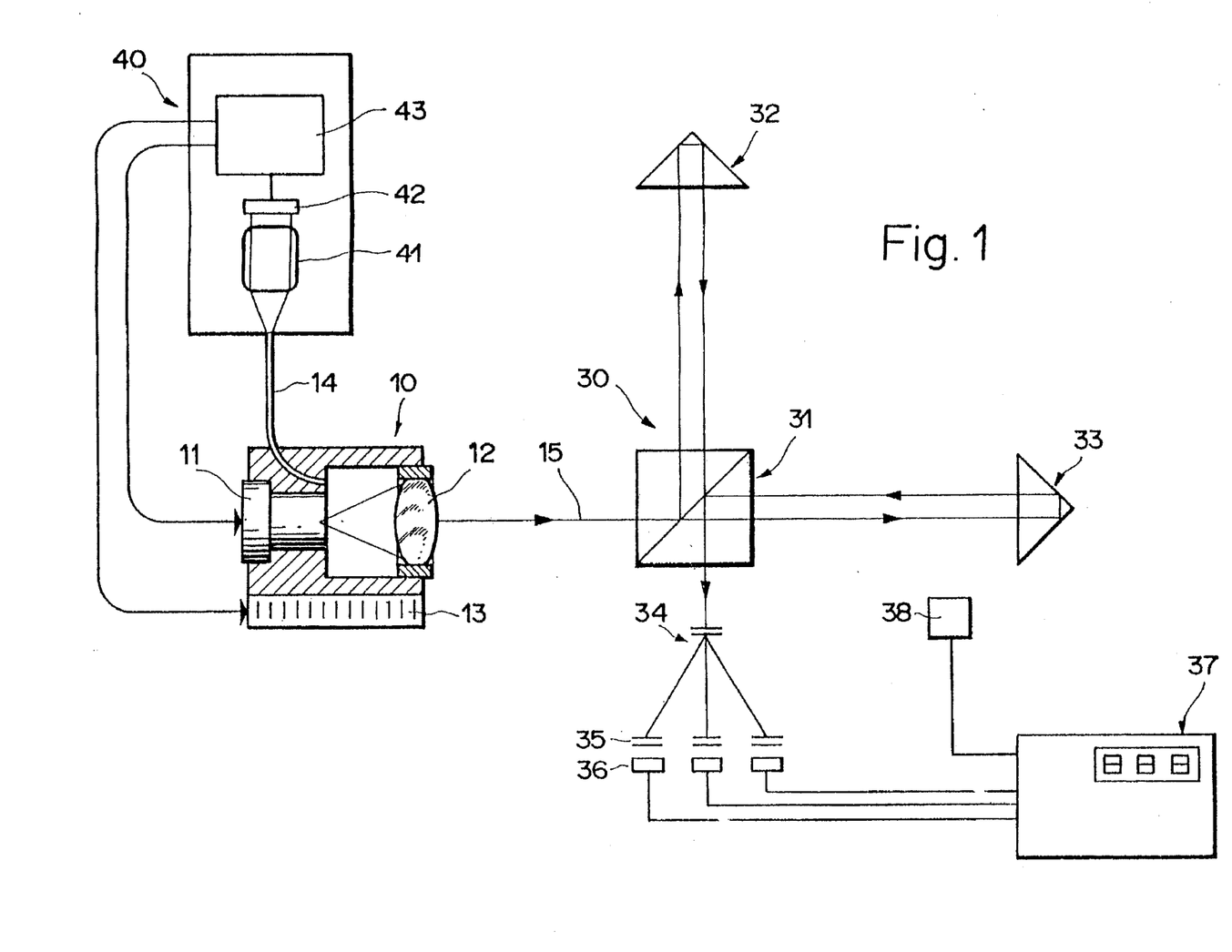
FIG. 1 is a diagram of a first embodiment of the invention applied to an interferometer, the laser module being shown as an elevation, partly in section.

FIG. 1 illustrates a first embodiment of the invention applied, by way of example, to a Michelson interferometer 30. Such interferometers are used to effect measurements of length with great precision, on the order of about 0.01 to 0.1 microns. They may be integrated in various devices for measuring length, height, movement, etc., in laboratories or in industry. However, analogous interferometers may also be used to measure very large distances, especially in space technology for measuring distances or separations of objects or celestial bodies in space, e.g., distances or positions of artificial satellites.

An operating light beam 15 emitted by a laser diode 11 in a laser module 10 is split in two by a beam-splitter element 31. A first beam, called the reference beam, is directed toward a fixed mirror 32, or reference mirror, while another beam, called the object beam, is directed toward a movable mirror 33 connected to an object whose position or movement it is desired to measure. The two reflected beams are returned toward the beam splitter, where they are reunited, creating an interference pattern. A fringe detector, comprising a diffraction grid 34, polarizers 35, and optical sensors 36, supplies signals to a calculating and processing unit 37. These signals are dependent on the interference pattern created by the reuniting of the object beam with the reference beam, thus furnishing a very precise indication of the position of movable mirror 33.

The principle of such interferometers is well known in the art. As the accuracy of measurement depends directly upon the stability of the wavelength of the light beam, recourse is often had to a gas laser as the laser source, thus limiting the use of this measurement technology to applications in which the constraints of cost, volume, and consumption are not too crucial.

It is also possible to use laser diodes stabilized in frequency or in wavelength as the light source. As indicated above, such laser diodes are very sensitive to the light reflected and returned to the diode.

For this reason, the interferometer must be designed so that the quantity of light returned to the diode is minimal. Mirrors 32 and 33 are preferably produced with the aid of retroreflectors in the form of cubical wedges. Such elements have the property of returning a reflected beam parallel to the incident ray, but not merged with it. They are preferably treated with an antireflective coating. In a modification, it is also possible to use a right prism or a sphere as a mirror. Depending on the application, however, movable mirror 33 may instead be simply a reflective or metallic surface of the measured object.

Optical elements 31–35 are preferably made with discrete optical components rather than as integrated optics. The advantage of discrete optics is to eliminate the interface step to which measuring beam 15 is subjected upon entering an integrated optics element. An additional cause of feedback toward the laser diode is thus avoided. Moreover, for small or medium-scale production, the discrete technology is more economical than the integrated technology.

The other elements liable to reflect light toward the laser diode, such as beam splitter 31, are carefully treated with antireflective coatings and disaligned by a few degrees relative to the optical axis. As compared with the Abou-Zeid design, the present invention permits elimination of one of the two beam splitters.

In order to obtain sufficient measuring accuracy with a laser diode, it must be stabilized in order to make it as insensitive as possible to variations of temperature or environment, for example. In the prior art, the wavelength of the light emitted by the laser diode is controlled by an outside reference, so that the diode always emits light of as constant a wavelength as possible.

Setting aging aside, it may be considered that with a constant temperature and injection current, a laser diode emits light of constant frequency. The frequency f and the wavelength $\lambda$ are linked by the equation $$\lambda = \frac{c}{n_{env} \cdot f}$$

wherein c represents the velocity of light in a vacuum, and $n_{env}$ represents the refractive index of the environment. In air, the refractive index depends upon the temperature, the pressure, and the vapor pressure according to Edlen's equation:

$$n = 1 + \frac{79 \cdot 10^{-6}}{T} \cdot \left( p + \frac{4800e}{T} \right)$$

wherein T is the temperature in degrees Kelvin, p is the pressure in millibars, and e is the vapor pressure in millibars.

When the injection current of the laser diode remains constant, the wavelength emitted is therefore seen to depend upon the refractive index of the environment. In devices for stabilizing the wavelength, it is necessary to compensate continuously for the variations in temperature and air pressure by modifying the injection current of the laser diode.

Laser diodes are generally wavelength-stabilized by means of an optical cavity ("etalon") which is not physically present on the optical path of the operating beam whose wavelength is supposed to be stabilized. In order to operate properly, this stabilization technique therefore presupposes a homogeneous temperature of the device as a whole, something which is very difficult to bring about in practice, especially for large-size interferometers.

In one embodiment of the invention, the laser diode is stabilized as to frequency rather than wavelength. Thus, the laser diode is controlled in such a way that the frequency of the light emitted remains constant. The wavelength of the emitted light, on the other hand, varies in accordance with the variations of temperature and pressure. In an exemplary application for an interferometer, the displacement measured therefore depends upon the refractive index over the path of the operating beam.

In order to obtain optimum measuring accuracy, the calculated measurement of length must be corrected. By means of a temperature, pressure, and/or vapor-pressure sensor 38, these parameters are measured and supplied to calculating and processing unit 37, which carries out the correction, e.g., with the aid of an algorithm or a correction table. In this way, the problem of stabilizing the laser diode is separated from that of correcting the refractive index, so that these problems can be dealt with by two distinct modules.

In principle, the use of various types of laser diodes in the laser module may be envisaged, e.g., laser diodes having a Fabry-Perot cavity, DBR diodes, or vertical-cavity diodes. In the present embodiments, the laser diode 11 used is an AsGaAl laser diode having a double-heterojunction structure. The laser diode is optimized and encapsulated so as to emit light on a single face, called the front face. By means of a collimating lens 12, the light beam is collimated and directed toward the interferometer. The temperature of the laser module assembly is controlled by means of heat control means 13. An optical fiber 14, placed in a manner to be described in more detail below, picks up a portion of the light emitted by the front face of the diode. This portion is called the controlling beam.

A control module 40 comprises an absorption cell 41 containing a vapor having a spectral absorption peak. The absorption spectrum of rubidium 87, for example, has a line to which the emission frequency of the diode may be subjected. Other gases may be used, however, e.g., other isotopes or mixtures of rubidium, cesium, water vapor, or any other element having an absorption peak. It is also possible to stabilize the laser diode on other types of reference cells than absorption cells, e.g., Fabry-Perot etalons or optical resonators.

The control beam is guided by optical fiber 14 to reference cell 41. The light passing through this cell is measured by an optical sensor 42 placed on the opposite side of cell 41. The light received by sensor 42 is minimal when the light frequency is equal to the absorption-peak frequency of the gas in the absorption cell, i.e., when there is maximum absorption. Optical sensor 42 supplies a signal to a module 43 for controlling the current of laser diode 11. By means of module 43, the injection current applied to laser diode 11 is controlled in such a way that the signal received by optical sensor 42 is always minimal, i.e., so that the light frequency emitted corresponds to the absorption frequency of the gas in cell 41.

In this preferred embodiment, control module 43 acts solely upon the injection current applied to laser diode 11 in order to vary the light frequency emitted. However, it is quite possible to stabilize the light frequency emitted by acting upon the temperature of the laser diode through a modified module, or to act simultaneously upon the temperature and upon the injection current of the laser diode.

By acting upon the injection current of laser diode 11, its emission frequency is modified, but also the light intensity emitted. If the absorption peak of the gas used is not very steep, sensor 42 is liable to detect variations due more to the variation in amplitude than to the variation in frequency. It may then be necessary to carry out a correction, either by providing for it in control means 43, or, as described in FIGS. 14 and 15 of the Abou-Zeid reference, by subtracting the signal measured before absorption cell 41 from the signal measured after it.

The laser module described may also be used for adjusting operating parameters of the laser diode other than the frequency or the wavelength. For instance, by modifying control module 40, it is possible to stabilize the light intensity emitted by the laser diode.

Figure 2:
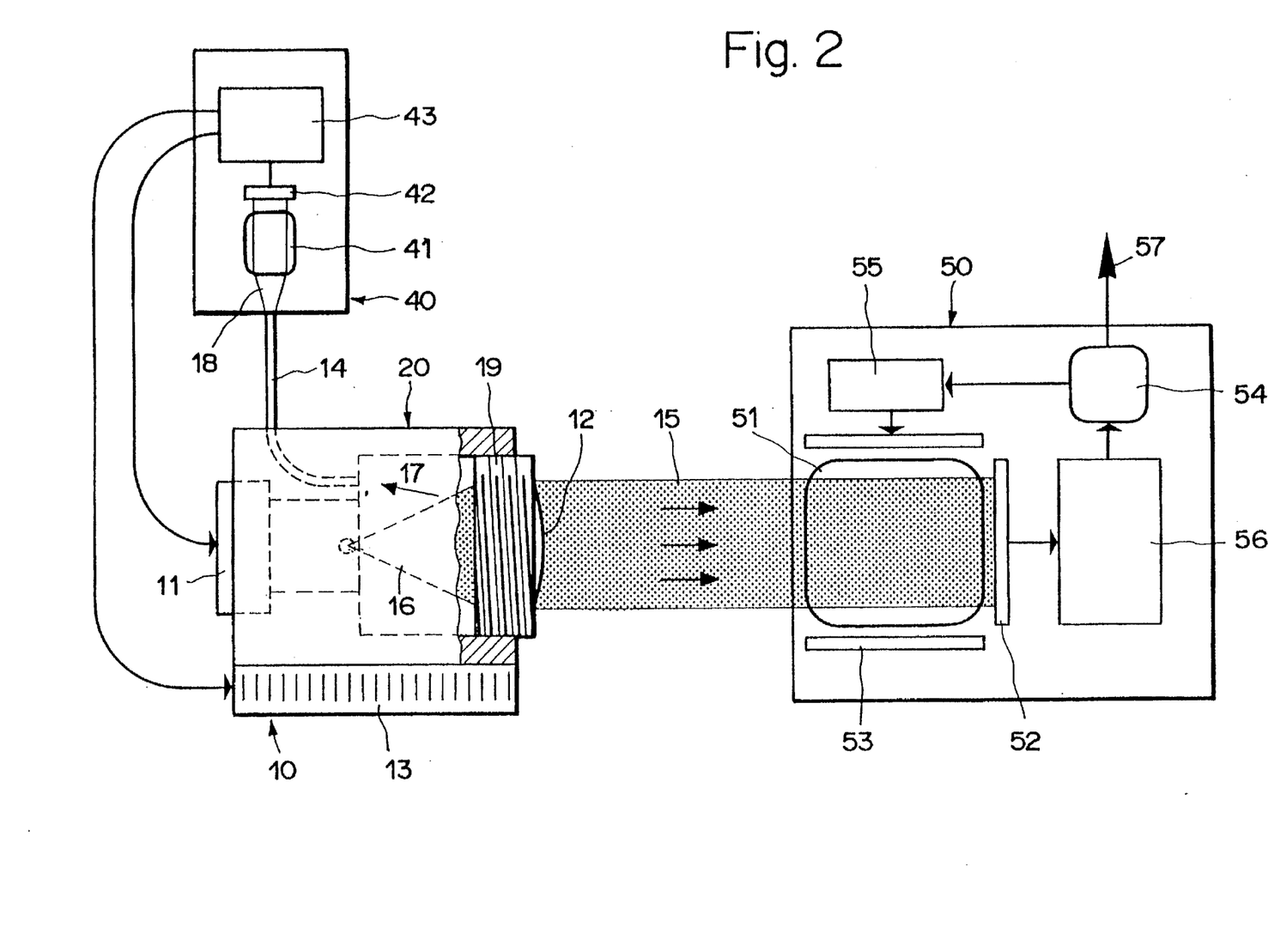
FIG. 2 is a detailed diagrammatic elevation, partly in section, of the laser module of the first embodiment.

The laser module and the principle of coupling the optical fiber in the first embodiment of the invention will now be examined in detail with reference to FIG. 2.

Laser module 10 comprises a case 20 temperature-stabilized with the aid of heat control module 13, which preferably takes the form of a Peltier element. Laser diode 11, encapsulated so as to emit a light beam 16 solely from its front face, is fixed in an aperture of case 20. By means of collimating lens 12 placed in front of laser diode 11, the divergent light emitted by the laser diode is collected and collimated into an emitted beam 15. Lens 12 is fixed to case 20 by means of a lens support 19 made of synthetic material or, preferably, of metal. Lens 12 itself may be made of synthetic material or of glass; the shape of this lens is shown only diagrammatically in the drawing. Lens 12 may possibly be composed of a group of lenses instead.

The reflections caused by the surface of collimating lens 12 and returned toward laser diode 11 are not particularly troublesome inasmuch as lens 12 is placed very close to laser diode 11. This type of feedback is less critical for the laser diode. Nonetheless, in order to minimize the reflections, lens 12 may be provided with antireflective coatings.

In one embodiment of the invention, heat control module 13 is disposed so as to control simultaneously the temperature of laser diode 11 and that of lens 12. By means of this design, the temperature of laser diode 11, lens 12, and the space between them can be kept constant. In this way, the optical feedback due to lens 12 remains absolutely constant in phase and in amplitude, thus avoiding abrupt changes of emission mode.

In order to limit heat transfer as much as possible, an air gap may be created in the cavity between laser diode 11 and lens 12. This gap may also be filled with a gas such as xenon limiting heat transfer, as is proposed, for example, in U.S. Pat. No. 5,195,102 to McLean et al. or in U.S. Pat. No. 5,387,881 assigned to Observatoire Cantonal de Neuchâtel, Switzerland.

According to the present invention, optical fiber 14 is placed in case 20 so as to collect part of the light 17 reflected or diffused by lens 12. If a portion 21 of the light emitted by laser diode 11 also reaches lens support 19, optical fiber 14 may be placed in such a way as to pick up a portion 22 of the light reflected or diffused by support 19. For this purpose, lens support 19 may be made of polished metal over a part 23 of its surface, or even covered at least partially with mirrors. As the quantity of light required by the controlling module is very slight, however, it is generally sufficient for optical fiber 14 to be placed so as to collect only part of the light reflected by the surface of collimating lens 12. Experiments have been carried out which show that it is thus possible to collect a small percentage of the light emitted by the laser diode, this generally being sufficient for the control. Disregarding the light lost in the laser module, the intensity of operating light beam 15 therefore represents almost the entire intensity of the light 16, 21 emitted by laser diode 11.

By means of optical fiber 14 thus coupled, a controlling light beam 18 of an intensity sufficient for operation of control module 40 can be collected without interfering with laser diode 11. It will be preferable to use a multi-mode fiber, which is more economical than a single-mode fiber and picks up more light.

A diaphragm (not shown) may be placed on the optical path after lens 12 to control the quantity of light emitted and the quality of the beam.

Figure 3:
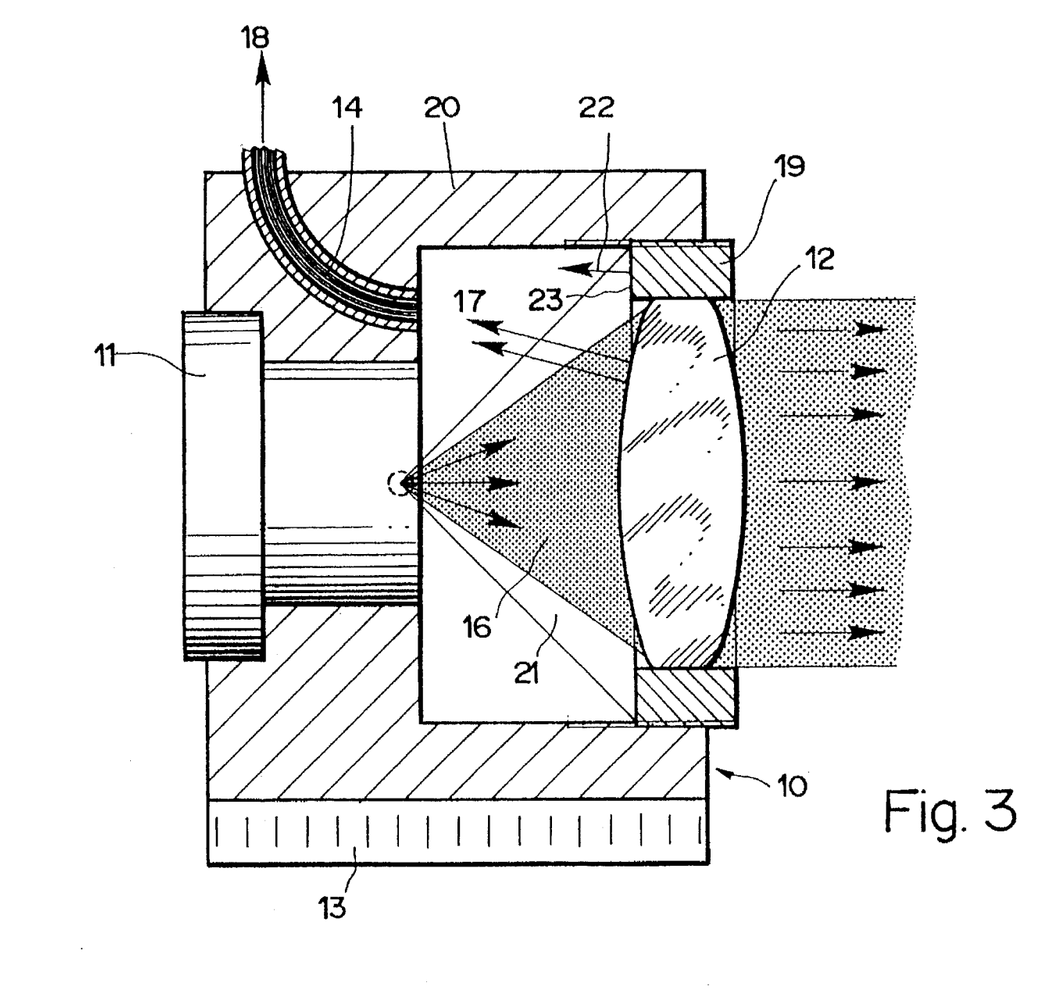
FIG. 3 is a diagram of the same embodiment as in FIG. 1, but applied to an atomic frequency oscillator.

With reference to FIG. 3, the application of the same embodiment of the invention in an atomic frequency oscillator will now be examined, identical components being designated by the same reference numerals.

Such atomic frequency oscillators are described particularly in the earlier-mentioned U.S. Pat. No. 5,148,437 and No. 5,387,881. It will therefore be useful to refer to those patents for a more detailed study of their operation, and only those features necessary for an understanding of the present invention will be repeated here.

In the same way as for the interferometer described with reference to FIG. 1, an atomic frequency oscillator 50 comprises a laser module 10 frequency-controlled by a cell containing an atomic or molecular vapor (e.g., of rubidium or cesium). Laser module 10 includes a laser diode 11 which emits an operating light beam 15 reaching atomic frequency oscillator 50. In a manner exactly similar to that described above, a controlling light beam 18 is taken off by means of a multi-mode optical fiber 14 coupled directly in laser module 10 so as to take off part of the light emitted by the front face of laser diode 11 and reflected or diffused by lens 12 or lens support 19.

A control module 40 similar to that described above allows the injection current of laser diode 11 and/or its temperature to be regulated in such a way as to stabilize the frequency of the emitted light 16. Module 40 is preferably disposed in a separate module in order to keep away thermal or electromagnetic interference caused by laser module 10 and atomic oscillator 50.

Operating light beam 15 is used in atomic frequency oscillator 50 for optically pumping a resonance cell 51 in an atomic resonator. Resonance cell 51 contains an atomic vapor, e.g., of rubidium or cesium, and is traversed by operating light beam 15. A photosensor 52 picks up the light transmitted by cell 51.

Cell 51 is placed in an RF resonator 53 fed by a quartz oscillator 54, the frequency of which is multiplied by a predetermined factor in a frequency multiplier 55. This frequency multiplier performs a dual function as a frequency multiplier and a synthesizer. Oscillator 54 also supplies an output signal 57 characterized by a very stable and well-defined frequency.

When the frequency of light 15 reaching the cavity is close to the resonance frequency characteristic of the kind of atom contained in resonance cell 51, the light intensity transmitted and received by photosensor 52 varies resonantly.

The signal sent by photosensor 52 is processed by an electronic control device 56 to correct the frequency of quartz oscillator 54 and to keep it in the predetermined ratio to the RF resonance characteristic of the atomic vapor. In this embodiment, the frequency of quartz oscillator 54 is 5 MHz and is increased by multiplier 55 to 6835 MHz. This value corresponds to the resonance frequency of the cell when it is filled with rubidium isotope 87.

In this embodiment, the resonator is an atomic resonator having a rubidium cell. However, the invention also applies to resonators with a cesium cell or a cell with any other atomic or molecular vapor or mixture of vapors. This might also be an atomic jet resonator, e.g., with a rubidium or cesium jet.

Figure 4:
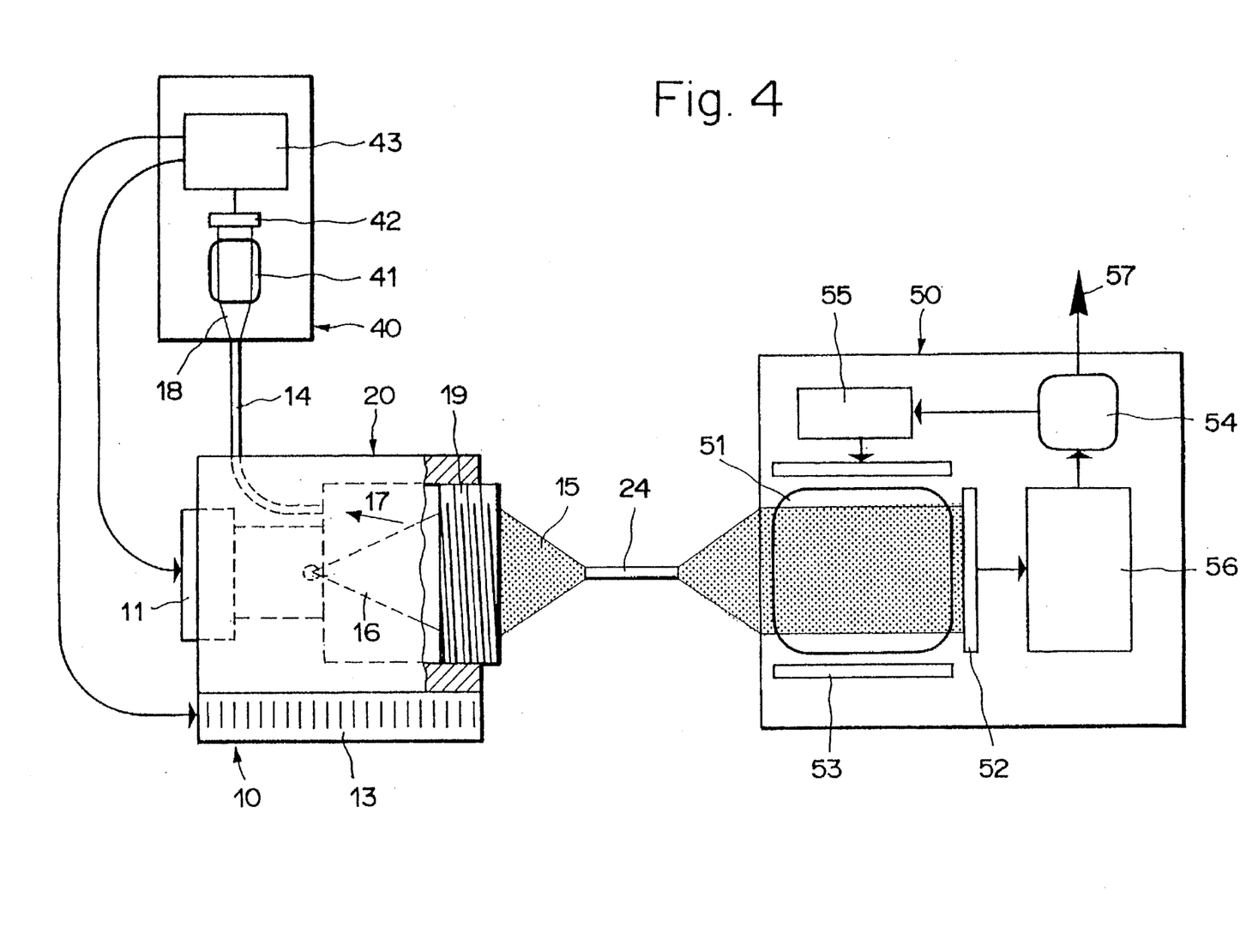
FIG. 4 is a diagram of a second embodiment of the invention applied to an atomic frequency oscillator.

FIG. 4 illustrates a second embodiment of the invention, still applied by way of example to an atomic frequency oscillator, allowing greater freedom for positioning the laser module while retaining the advantages of the first embodiment illustrated in FIGS. 1 and 3.

In this embodiment, the collimation lens is replaced by a focusing lens for coupling laser module 10 to a multi-mode optical fiber 24. A temperature-control module 13 simultaneously regulates the temperatures of laser diode 11 and the lens in front of the laser diode. The operating light beam 15 is conveyed by optical fiber 24 to atomic frequency oscillator 50. In the same way as before, controlling light beam 18 is conveyed to control module 40 by an optical fiber 14 coupled directly to laser module 10 so as to collect part of the light emitted by the front face of laser diode 11 and reflected or diffused by the lens or by lens support 19. The other elements of laser module 10 are identical to those of the first embodiment.

This embodiment makes it possible to place laser module 10 in a location sheltered from electromagnetic or heat interference caused by device 30 or 50, and to facilitate construction and alignment of the device.

This second embodiment is particularly well adapted to an application of laser module 10 as an optical transmitter over fiber optics. Optical fiber 24 is then a data-transmission fiber. For this application, a single-mode optical fiber 24 will preferably be chosen. This type of fiber allows a greater output of data than multi-mode fibers. Coupling a single-mode optical fiber is more delicate than coupling a multi-mode fiber, especially because of the small opening. Additional coupling precautions, not explained in detail here but well known to those skilled in the art, will therefore be necessary. For this application, module 43 for controlling the injection current of the laser diode further comprises an analog or digital modulator.

Although the foregoing description makes reference to applications in the fields of interferometry, atomic frequency oscillators, and fiber optics transmission, it will be understood that the invention is also suitable for other applications using laser modules stabilized as to frequency or wavelength, e.g., applications in the fields of spectroscopy, of lidars, or of other fiber optics communications.

What is claimed is:

1. An electro-optical device-comprising:
   a laser diode having a front face,
   a lens mounted in front of said laser diode,
   an optical fiber,
   and a control module for controlling said laser diode, said laser diode emitting from said front face a light beam traversing said lens to constitute an operating light beam, at least part of the light emitted by said laser diode constituting a controlling light beam, said controlling light beam being conveyed by said optical fiber to said control module, said control module using said controlling light beam to determine at least one operating parameter of said laser diode, and said optical fiber being coupled to said laser module for collecting part of the light reflected and diffused by said lens.

2. The electro-optical device of claim 1, wherein the optical path between said laser diode and said control module comprises no beam-splitting elements.

3. The electro-optical device of claim 2, wherein said control module uses said controlling light beam to determine the injection current of said laser diode for stabilizing the frequency of the light emitted by said laser diode.

4. The electro-optical device of claim 3, wherein said control module comprises a reference cell, an optical sensor, and means for controlling the injection current of said laser diode, said controlling light beam being guided by said optical fiber through said reference cell to said optical sensor.

5. The electro-optical device of claim 4, wherein said reference cell is an absorption cell containing an atomic or molecular vapor and having a spectral absorption peak to which the emission frequency of said laser diode may be subjected.

6. The electro-optical device of claim 2, wherein said control module uses said controlling light beam to determine the temperature of said laser diode for stabilizing the frequency of the light emitted by said laser diode.

7. The electro-optical device of claim 6, wherein said control module comprises a reference cell, an optical sensor, and means for controlling the temperature of said laser diode, said controlling light beam being guided by said optical fiber through said reference cell to said optical sensor.

8. The electro-optical device of claim 7, wherein said reference cell is an absorption cell containing an atomic or molecular vapor and having a spectral absorption peak to which the emission frequency of said laser diode may be subjected.

9. The electro-optical device of claim 2, further comprising a temperature control module for controlling simultaneously the temperatures of said laser diode and said lens.

10. The electro-optical device of claim 2, wherein said operating light beam is used to carry out a measurement.

11. The electro-optical device of claim 10, where in said operating light beam passes after the lenses through discrete optical components disaligned with respect to the optical axis for limiting the feedback in the laser diode.

12. The electro-optical device of claim 10, further comprising a second optical fiber coupled to said laser module, said operating light beam being conveyed by said second optical fiber.

13. The electro-optical device of claim 12, wherein said operating light beam is used to carry out a transmission.

14. The electro-optical device of claim 13, further comprising a second optical fiber coupled to said laser module, said operating light beam being conveyed by said second optical fiber.

15. An interferometer comprising an electro-optical device including a laser diode having a front face, a lens, an optical fiber, and a control module for controlling said laser diode, said laser diode emitting from said front face a light beam traversing said lens to constitute an operating light beam, at least part of the light emitted by said laser diode constituting a controlling light beam, said controlling light beam being conveyed by said optical fiber to said control module, said control module using said controlling light beam to determine at least one operating parameter of said laser diode, and said optical fiber being coupled to said laser module for collecting part of the light reflected and diffused by said lens, wherein the optical path between said laser diode and said control module comprises no beam-splitting element, said operating light beam being used to carry out a measurement, and said operating light beam passing after the lenses through discrete optical components disaligned with respect to the optical axis for limiting the feedback in the laser diode.

16. An atomic oscillator comprising an electro-optical device including a laser diode having a front face, a lens, an optical fiber, and a control module for controlling said laser diode, said laser diode emitting from said front face a light beam traversing said lens to constitute an operating light beam, at least part of the light emitted by said laser diode constituting a controlling light beam, said controlling light beam being conveyed by said optical fiber to said control module, said control module using said controlling light beam to determine at least one operating parameter of said laser diode, and said optical fiber being coupled to said laser module for collecting part of the light reflected and diffused by said lens, wherein the optical path between said laser diode and said control module comprises no beam-splitting element, said operating light beam being used to carry out a measurement, and said operating light beam passing after the lenses through discrete optical components disaligned with respect to the optical axis for limiting the feedback in the laser diode, wherein said operating light beam is used for optically pumping a resonance cell.

17. A spectroscope comprising an electro-optical device including a laser diode having a front face, a lens, an optical fiber, and a control module for controlling said laser diode, said laser diode emitting from said front face a light beam traversing said lens to constitute an operating light beam, at least part of the light emitted by said laser diode constituting a controlling light beam, said controlling light beam being conveyed by said optical fiber to said control module, said control module using said controlling light beam to determine at least one operating parameter of said laser diode, and said optical fiber being coupled to said laser module for collecting part of the light reflected and diffused by said lens, wherein the optical path between said laser diode and said control module comprises no beam-splitting element, said operating light beam being used to carry out a measurement, and said operating light beam passing after the lenses through discrete optical components disaligned with respect to the optical axis for limiting the feedback in the laser diode.

18. A transmitter transmitting over fiber optics, comprising an electro-optical device including a laser diode having a front face, a lens, an optical fiber, and a control module for controlling said laser diode, said laser diode emitting from said front face a light beam traversing said lens to constitute an operating light beam, at least part of the light emitted by said laser diode constituting a controlling light beam, said controlling light beam being conveyed by said optical fiber to said control module, said control module using said controlling light beam to determine at least one operating parameter of said laser diode, and said optical fiber being coupled to said laser module for collecting part of the light reflected and diffused by said lens, wherein the optical path between said laser diode and said control module comprises no beam-splitting element, further comprising a second optical fiber coupled to said laser module, said operating light beam being conveyed by said second optical fiber and being used to carry out a transmission.

19. A lidar comprising an electro-optical device including a laser diode having a front face, a lens, an optical fiber, and a control module for controlling said laser diode, said laser diode emitting from said front face a light beam traversing said lens to constitute an operating light beam, at least part of the light emitted by said laser diode constituting a controlling light beam, said controlling light beam being conveyed by said optical fiber to said control module, said control module using said controlling light beam to determine at least one operating parameter of said laser diode, and said optical fiber being coupled to said laser module for collecting part of the light reflected and diffused by said lens.

* * * * *